(12) United States Patent
Kwon et al.

(10) Patent No.: US 8,674,954 B2
(45) Date of Patent: Mar. 18, 2014

(54) ORGANIC LIGHT EMITTING DIODE DISPLAY AND METHOD OF MANUFACTURING THE SAME

(75) Inventors: Do-Hyun Kwon, Yongin (KR); Il-Jeong Lee, Yongin (KR); Choong-Youl Im, Yongin (KR); Young-Dae Kim, Yongin (KR); Ju-Won Yoon, Yongin (KR); Jong-Mo Yeo, Yongin (KR); Cheol-Ho Yu, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 805 days.

(21) Appl. No.: 12/923,070

(22) Filed: Aug. 31, 2010

(65) Prior Publication Data

US 2011/0163980 A1    Jul. 7, 2011

(30) Foreign Application Priority Data

Jan. 6, 2010    (KR) .................. 10-2010-0000929

(51) Int. Cl.
  *G06F 3/041*    (2006.01)
(52) U.S. Cl.
  USPC .......................................................... 345/173
(58) Field of Classification Search
  USPC .......................................................... 345/173
  See application file for complete search history.

(56) References Cited

U.S. PATENT DOCUMENTS

| | | | |
|---|---|---|---|
| 6,765,629 B1 * | 7/2004 | Jeong et al. | 349/12 |
| 7,106,307 B2 * | 9/2006 | Cok | 345/173 |
| 8,477,267 B2 * | 7/2013 | Fujisawa et al. | 349/95 |
| 2003/0030626 A1 * | 2/2003 | Matsuda et al. | 345/173 |
| 2003/0222857 A1 * | 12/2003 | Abileah | 345/173 |
| 2004/0141096 A1 * | 7/2004 | Mai | 349/12 |
| 2007/0134459 A1 * | 6/2007 | Hubert et al. | 428/40.1 |
| 2011/0048611 A1 * | 3/2011 | Carre et al. | 156/73.1 |

FOREIGN PATENT DOCUMENTS

| | | |
|---|---|---|
| JP | 2008-292982 A | 12/2008 |
| KR | 10-1998-053666 A | 9/1998 |
| KR | 20-1999-0037939 U | 10/1999 |
| KR | 10-2001-0045767 A | 6/2001 |
| KR | 10-2001-0096644 A | 11/2001 |
| KR | 10-2006-0034777 A | 4/2006 |
| KR | 10-2007-0120855 A | 12/2007 |
| KR | 10-2008-0067394 A | 7/2008 |

\* cited by examiner

*Primary Examiner* — Anthony Ho
(74) *Attorney, Agent, or Firm* — Lee & Morse, P.C.

(57) ABSTRACT

A method of manufacturing an organic light emitting diode display includes forming an organic layer on a support, forming a touch sensor on the organic layer, the touch sensor including a touch electrode pattern and a polarizing layer, separating the touch sensor from the support by removing the organic layer, and attaching the touch sensor to an organic light emitting diode display panel.

14 Claims, 8 Drawing Sheets

ORGANIC LIGHT EMITTING DIODE DISPLAY AND METHOD OF MANUFACTURING THE SAME

BACKGROUND

1. Field

The described technology relates generally to an organic light emitting diode display and a manufacturing method thereof, and more particularly, to an organic light emitting diode display having a touch screen function and a method of manufacturing the same.

2. Description of the Related Art

An organic light emitting diode display, which has a self emissive characteristic and does not require a separate light source, is advantageous in terms of down-sizing and light weight. Furthermore, as the organic light emitting diode display involves high quality characteristics, e.g., low power consumption, high luminance, and short response time, it has been spotlighted as a next generation display device for portable electronics.

The organic light emitting diode display includes an organic light emitting diode with an anode, an organic emissive layer, and a cathode, and a thin film transistor for driving the organic light emitting diode. Holes from the anode and electrons from the cathode are combined with each other within the organic emissive layer so as to generate excitons. When the excitons drop from an excited state to a ground state, energy is generated to emit light. The organic light emitting diode display displays an image by way of the emitted light.

The organic light emitting diode display may have a touch screen function to conduct various user interface (UI) operations. In order to realize such a touch screen function, a touch panel for recognizing the input means, e.g., a pen or a finger, may be mounted on the organic light emitting diode display panel, e.g., internally or externally.

The above information disclosed in this Background section is only for enhancement of understanding of the background of the described technology and therefore it may contain information that does not form the prior art that is already known in this country to a person of ordinary skill in the art.

SUMMARY

Embodiments are therefore directed to an organic light emitting diode display having a touch screen function and a manufacturing method thereof, which substantially overcome one or more of the problems due to the limitations and disadvantages of the related art.

It is therefore a feature of an embodiment to provide an organic light emitting diode display having an internal touch screen member having a simplified structure.

It is another feature of an embodiment to provide an organic light emitting diode display having an internal touch screen member capable of reducing thickness of the display.

It is yet another feature of an embodiment to provide a method of manufacturing an organic light emitting diode display including one or more of the above features.

At least one of the above and other features and advantages may be realized by providing a method of manufacturing an organic light emitting diode display, including forming an organic layer on a support, forming a touch sensor on the organic layer, the touch sensor including a touch electrode pattern and a polarizing layer, separating the touch sensor from the support by removing the organic layer, and attaching the touch sensor to an organic light emitting diode display panel.

In the touch sensor separation step, the organic layer may be removed by illuminating a laser thereto from the side of the support thereto. The touch sensor formation step may include forming the touch electrode pattern on the organic layer, and forming the polarizing layer on the touch electrode pattern.

In the attachment of the touch sensor to the organic light emitting diode display panel, a surface of the touch sensor with the touch electrode pattern may be attached to the organic light emitting diode display panel.

A passivation layer may be formed on the touch electrode pattern between the touch electrode pattern formation step and the polarizing layer formation step. The passivation layer may have a single-layered structure with an inorganic or organic material-based layer, or a multiple-layered structure with an inorganic material-based layer and an organic material-based layer. The inorganic material may be selected from silicon oxide and silicon nitride, and the organic material may be selected from a polyimide and an acryl.

The touch sensor formation step may include forming a protective layer on the organic layer, forming the touch electrode pattern on the protective layer, and forming the polarizing layer on the touch electrode pattern.

In the attachment of the touch sensor to the organic light emitting diode display panel, the polarizing layer of the touch sensor may be attached to the organic light emitting diode display panel.

A passivation layer may be formed on the touch electrode pattern between the touch electrode pattern formation step and the polarizing layer formation step.

The passivation layer may have a single-layered structure with an inorganic or organic material-based layer, or a multiple-layered structure with an inorganic material-based layer and an organic material-based layer. The inorganic material may be selected from silicon oxide and silicon nitride, and the organic material may be selected from a polyimide and an acryl.

The touch electrode pattern may be formed by patterning a transparent conductive layer through photolithography or laser ablation. The support may contain glass.

At least one of the above and other features and advantages may also be realized by providing an organic light emitting diode display, including an organic light emitting diode display panel, and a touch sensor attached to the organic light emitting diode display panel. The touch sensor may include a touch electrode pattern and a polarizing layer.

A surface of the touch sensor with the touch electrode pattern may be attached to the organic light emitting diode display panel. A surface of the polarizing layer with no touch electrode pattern may be attached to the organic light emitting diode display panel. In this case, a protective layer may cover the touch electrode pattern.

A passivation layer may be formed between the touch electrode pattern and the polarizing layer. The passivation layer may have a single-layered structure with an inorganic or organic material-based layer, or a multiple-layered structure with an inorganic material-based layer and an organic material-based layer. The inorganic material may be selected from the group consisting of silicon oxide and silicon nitride, and the organic material may be selected from the group consisting of a polyimide and an acryl.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0000929, filed on Jan. 6, 2010, in the Korean Intellectual Property Office, and entitled: "Organic Light Emitting Diode Display and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
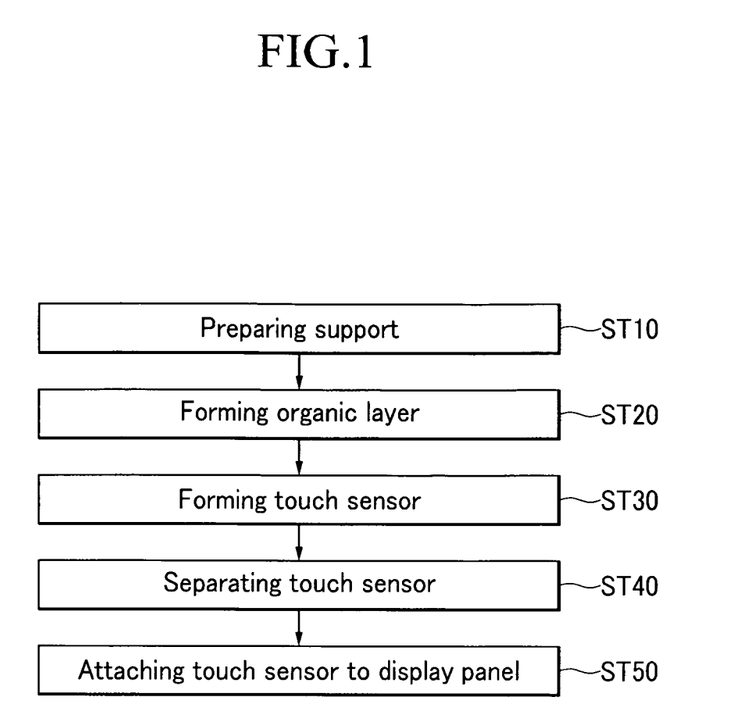
FIG. 1 illustrates a flowchart of a method of manufacturing an organic light emitting diode display according to a first exemplary embodiment.

An organic light emitting diode display and a manufacturing method thereof according to a first exemplary embodiment will now be described with reference to FIG. 1 and FIG. 2A to FIG. 2F. FIG. 1 illustrates a flowchart of a method of manufacturing an organic light emitting diode display according to a first exemplary embodiment, and FIG. 2A to FIG. 2F illustrate cross-sectional views of stages in a method of manufacturing the organic light emitting diode display according to the first exemplary embodiment.

As illustrates in FIG. 1, a method of manufacturing the organic light emitting diode display according to the present exemplary embodiment may include preparing a support in operation ST10, forming an organic layer in operation ST20, forming a touch sensor in operation ST30, separating the touch sensor in operation ST40, and attaching the touch sensor to a display panel in operation ST50. The respective processing steps will be described in detail with reference to FIG. 2A to FIG. 2F.

Figure 2A:
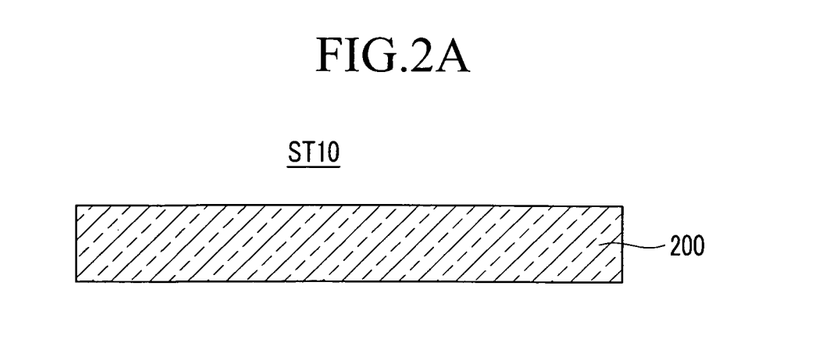
FIG. 2A to FIG. 2F illustrate cross-sectional views of stages in a method of manufacturing an organic light emitting diode display according to a first exemplary embodiment.

First, as illustrated in FIG. 2A, a support 200 may be prepared in operation ST10. The support 200 may be formed of a material that is not deformed by a laser and is suitable for forming an organic layer thereon to be described later. For example, the support 200 may include glass.

Figure 2B:
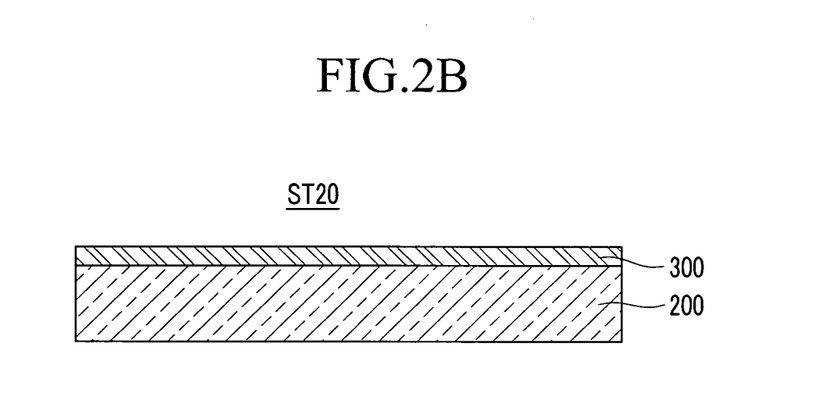

As illustrated in FIG. 2B, an organic layer 300 may be formed on, e.g., directly on, the support 200 in operation ST20. The organic layer 300 may be formed of any suitable organic material that can be removed by way of a laser ablation process. For example, the organic layer 300 may be formed of a polyimide (PI), an acryl, etc.

Figure 2C:
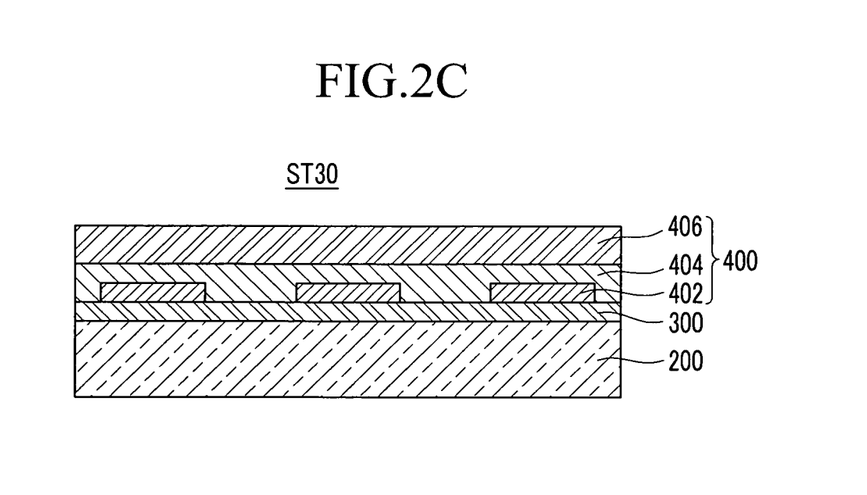

As illustrated in FIG. 2C, a touch sensor 400 may be formed on the organic layer 300 in operation ST30, e.g., the organic layer 300 may be between the touch sensor 400 and the support 200. As further illustrated in FIG. 2C, the touch sensor 400 may include a touch electrode pattern 402 on the organic layer 300, a passivation layer 404 on the touch electrode pattern 402, and a polarizing layer 406 on the passivation layer 404.

The touch electrode pattern 402 may have various patterns that are capable of recognizing an input means, e.g., a pen or a finger. The touch electrode pattern 402 may be formed of a transparent conductive material, such that the touch electrode pattern 402 may not obstruct the displaying of the organic light emitting diode display panel. For example, the touch electrode pattern 402 may be formed of indium tin oxide (ITO).

For example, the touch electrode pattern 402 may be formed by depositing a transparent conductive layer (not shown) on, e.g., directly on, the organic layer 300 with a transparent conductive material, and patterning the transparent conductive layer through photolithography or laser ablation, e.g., to form a plurality of separate patterns. However, present embodiments are not limited thereto, and the touch electrode pattern 402 may be formed in various manners.

The passivation layer 404 may be deposited on the organic layer 300 to cover the touch electrode pattern 402, e.g., some portions of the passivation layer 404 may be deposited directly on the organic layer 300 between adjacent patterns of the touch electrode pattern 402. For example, the passivation layer 404 may have a single-layered structure formed of an inorganic material-based layer or an organic material-based layer. In another example, the passivation layer 404 may have a multiple-layered structure formed of at least one inorganic material-based layer and at least one organic material-based layer. Various materials may be used as the organic and inorganic materials in the passivation layer 404, so as to protect the touch electrode patterns 402 and to insulate adjacent touch electrode patterns 402 from each other. Further, the passivation layer 404 may have a planarized upper surface, i.e., a surface facing away from the support 200, so a surface to be attached to the polarizing layer 406 may be flattened. For example, inorganic materials in the passivation layer 404 may include silicon oxide and/or silicon nitride, and organic materials in the passivation layer 404 may include a polyimide and/or an acryl.

The polarizing layer 406 may be formed on, e.g., directly on, the passivation layer 404. The polarizing layer 406 may have a polarizing characteristic, so as to enhance visibility of the organic light emitting diode display.

Figure 2D:
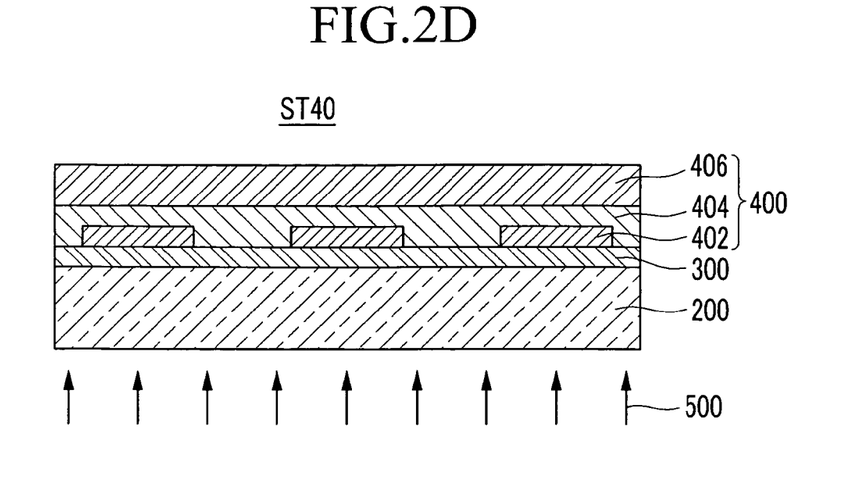
Figure 2E:
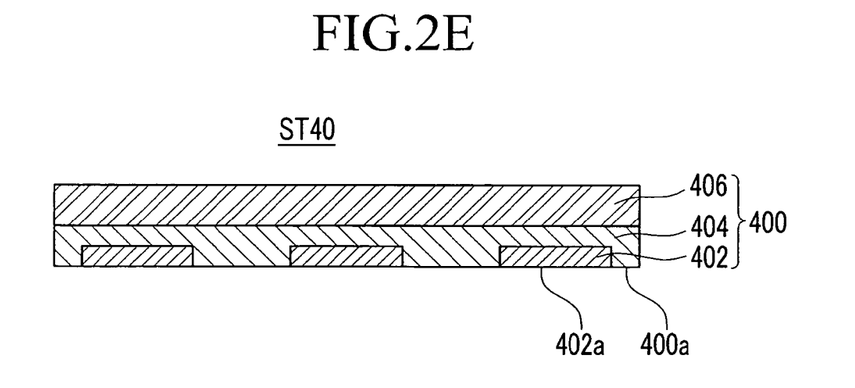

Thereafter, as illustrated in FIGS. 2D and 2E, the organic layer 300 may be removed in operation ST40 in order to separate the touch sensor 400 from the support 200. In detail, as illustrated in FIG. 2D, the organic layer 300 may be partially or wholly melted through laser ablation via a laser 500. As further illustrated in FIG. 2D, the laser 500 may be illuminated from a side of the support 200, i.e., the laser 500 may be irradiated directly toward a lower surface of the support 200 and through the support 200 to melt the organic layer 300. Once the organic layer 300 is removed, as illustrated in FIG. 2E, the touch sensor 400 may be prepared to be mounted on an organic light emitting diode display panel.

It is noted that if the organic layer 300 is only partially removed by the laser 500, the remaining organic layer 300 may be removed by conducting a separate chemical process in order to provide a substantially smooth lower surface of the touch sensor 400, i.e., a surface facing the support 200 in FIG. 2D. This is to enhance the adhesion characteristic of the organic light emitting diode display panel through smoothing the lower surface of the touch sensor 400 to be attached to the organic light emitting diode display panel.

Figure 2F:
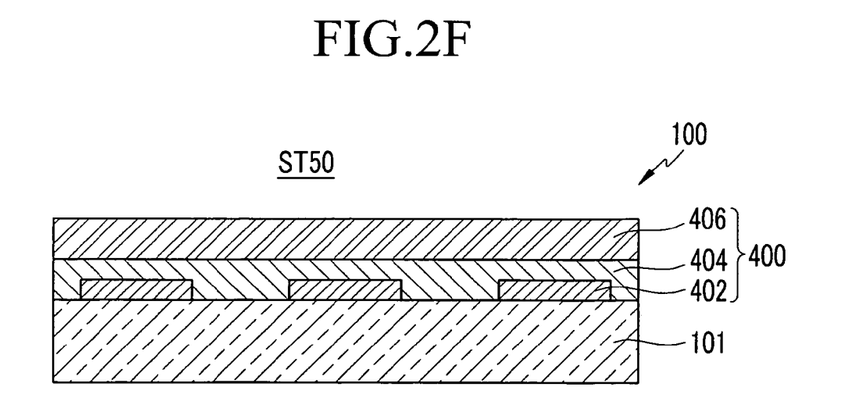

Thereafter, as illustrated in FIG. 2F, the touch sensor 400 may be attached to an organic light emitting diode display panel 101 of an organic light emitting diode display 100 by using an adhesive in operation ST50. As further illustrated in FIG. 2F, the lower surface of the touch sensor 400, i.e., a surface including the touch electrode patterns 402, may face the organic light emitting diode display panel 101, e.g., may face a light emitting surface of the organic light emitting diode display panel 101. For example, a lower surface 400a of the touch sensor 400 and lower surfaces 402a of the touch electrode patterns 402 may be substantially coplanar, and may contact, e.g., directly, the organic light emitting diode display panel 101.

According to example embodiments, the lower surface 400a of the touch sensor 400 overlaid with the touch electrode pattern 402 may be directly attached to the organic light emitting diode display panel 101. In this way, as it is not necessary to provide a separate layer for protecting the touch electrode pattern 402, the manufacturing process of the organic light emitting diode display 100 may be simplified at a low cost and overall thickness may be decreased.

Further, as the touch sensor 400 including the polarizing layer 406 and the touch electrode pattern 402 is formed by removing the organic layer 300 through laser ablation, the touch sensor 400 may be formed through simplified processing steps. Furthermore, the manufacturing process of the organic light emitting diode display 100 having excellent visibility and the touch sensor 400 may be simplified further due to attachment of the touch sensor 400 to the organic light emitting diode display panel 101. In addition, the touch sensor 400 may have a thin structure, i.e., a small thickness, thereby reducing overall thickness of the organic light emitting diode display 100.

As illustrated in FIG. 2F, the organic light emitting diode display 100 manufactured according to the exemplary embodiment may include the organic light emitting diode display panel 101 and the touch sensor 400 attached to the organic light emitting diode display panel 101. The touch sensor 400 may include the touch electrode pattern 402, the passivation layer 404, and the polarizing layer 406, and the lower surface 400a of the touch sensor 400 with the touch electrode pattern 402 may be attached to the organic light emitting diode display panel 101.

The touch electrode pattern 402 may include first and second patterns formed on a same plane, so a capacitance between the first and second patterns may vary when any input means, e.g., a finger, touches it, to determine touch. Various structures may be used as the touch electrode pattern 402.

Various structures may be used for the organic light emitting diode display panel 101. An exemplary structure thereof will be described with reference to FIGS. 3 and 4.

Figure 3:
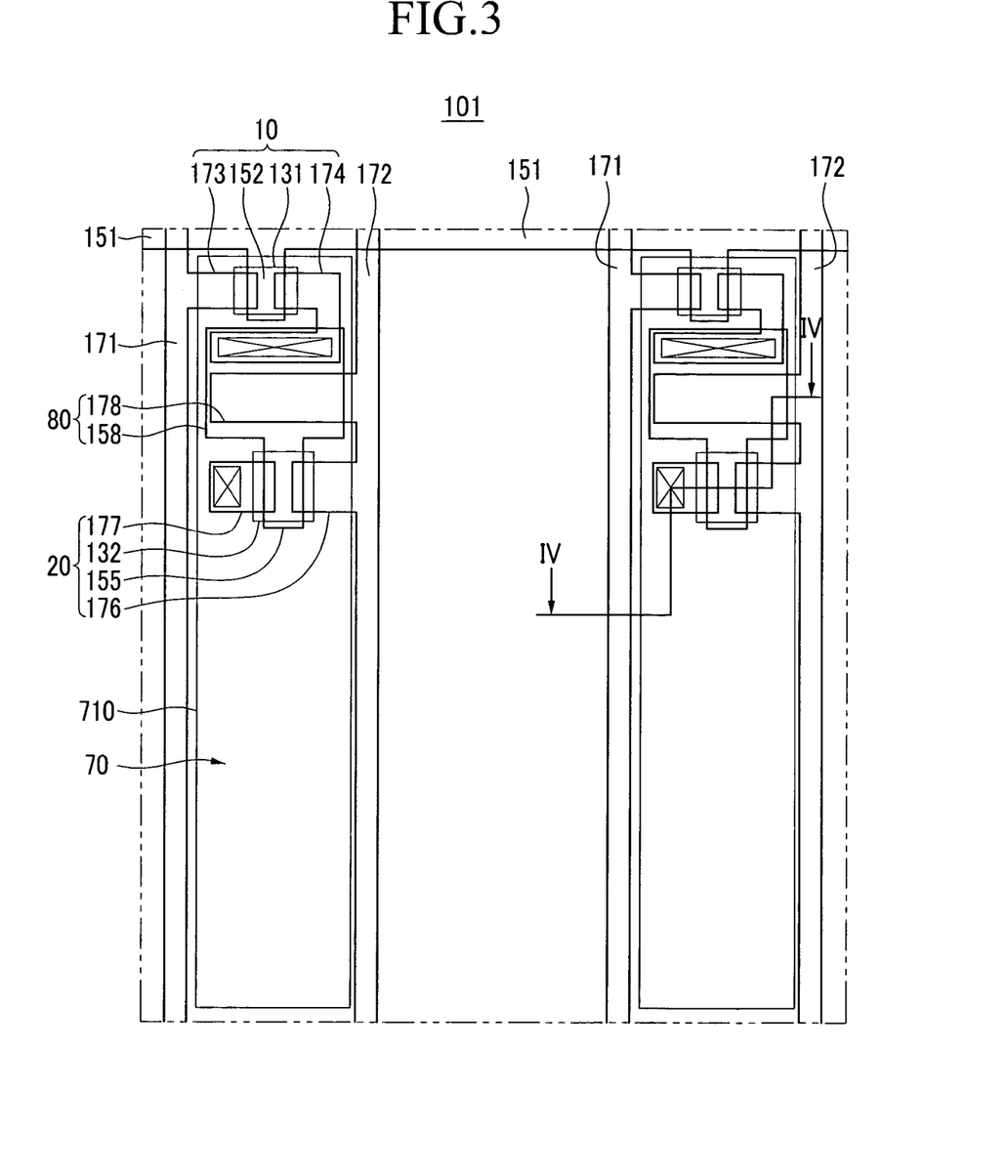
FIG. 3 illustrates a layout view of an organic light emitting diode display according to a first exemplary embodiment.
Figure 4:
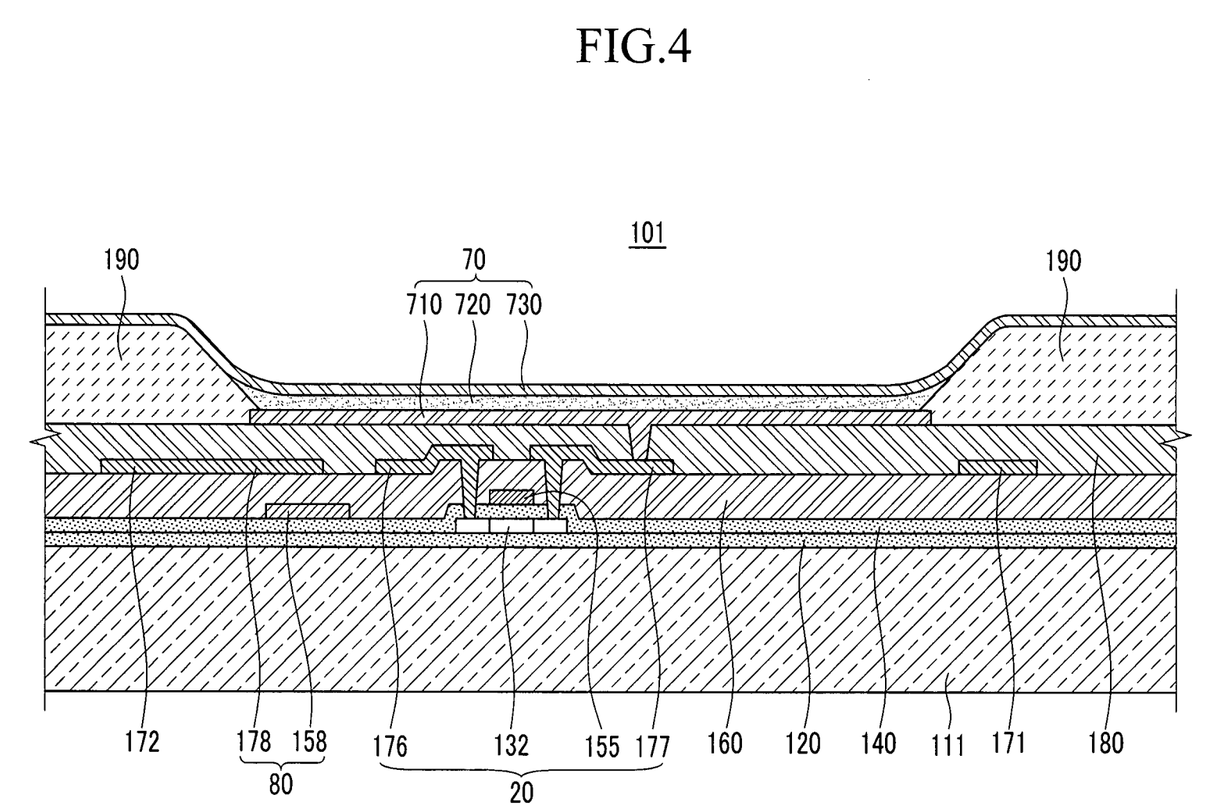
FIG. 4 illustrates a cross-sectional view of the organic light emitting diode display along IV-IV of FIG. 3.

FIG. 3 illustrates a layout view of an organic light emitting diode display panel according to a first exemplary embodiment, and FIG. 4 illustrates a cross-sectional view of the organic light emitting diode display panel taken along line IV-IV of FIG. 3. FIG. 3 and FIG. 4 illustrate an active matrix (AM) type of the organic light emitting diode display panel 101 with a 2Tr-1Cap structure, where a pixel is provided with two thin film transistors (TFT) 10 and 20 and a capacitor 80. However, present exemplary embodiments are not limited thereto. In the organic light emitting diode display panel 101, the pixel may be provided with three transistors or more and two capacitors or more, or may be otherwise-structured with a separate wire. A pixel is a minimum image displaying unit, and the organic light emitting diode display panel 101 displays images through a plurality of pixels.

As illustrated in FIG. 3 and FIG. 4, the organic light emitting diode display panel 101 according to the present exemplary embodiment may include a switching thin film transistor 10, a driving thin film transistor 20, the capacitor 80, and an organic light emitting diode (OLED) 70 in each pixel. The organic light emitting diode display panel 101 may include a plurality of pixels on a substrate 111. The organic light emitting diode display panel 101 may further include gate lines 151 arranged in a first direction, and data lines 171 and common power lines 172 crossing the gate lines 151 in an insulated manner. Here, one pixel is defined by taking the gate lines 151 and the data and common power lines 171 and 172 as a boundary, but it is not limited thereto.

A buffer layer 120 may be formed on the substrate 111, e.g., between the substrate 111 and each of the switching thin film transistor 10 and the OLED 70. The buffer layer 120 may prevent unnecessary elements, e.g., impure elements or moisture, from intruding upon the target surface, and may simultaneously flatten the substrate 111. However, the buffer layer 120 is not necessarily required, and may be omitted depending upon the kinds and processing conditions of the substrate 111.

The OLED 70 may include a pixel electrode 710, an organic emissive layer 720 formed on the pixel electrode 710, and a common electrode 730 formed on the organic emissive layer 720. At least one pixel electrode 710 is formed in each pixel, so the organic light emitting diode display panel 101 may have a plurality of pixel electrodes 710 spaced apart from each other by a predetermined distance.

The pixel electrode 710 may function as an anode being a hole injection electrode, and the common electrode 730 may function as a cathode being an electron injection electrode. However, present embodiments are not limited thereto, and depending upon driving of the organic light emitting diode display panel 101, the pixel electrode 710 may function as a cathode while the common electrode 730 may function as an anode.

The holes and the electrons injected into the organic emissive layer 720 are combined with each other so as to form excitons. When the excitons drop from an excited state to a ground state, emission of light occurs.

The capacitor 80 may include a pair of capacitor plates 158 and 178 with an interlayer insulating layer 160 therebetween. The interlayer insulating layer 160 functions as a dielectric. The capacitance of the capacitor 80 is determined in accordance with charges accumulated in the capacitor 80 and the voltages applied to the capacitor plates 158 and 178.

The switching thin film transistor 10 may include a switching semiconductor layer 131, a switching gate electrode 152, a switching source electrode 173, and a switching drain electrode 174. The driving thin film transistor 20 may include a driving semiconductor layer 132, a driving gate electrode 155, a driving source electrode 176, and a driving drain electrode 177. In the present exemplary embodiment, the switching and driving semiconductor layers 131 and 132 and the switching and driving gate electrodes 152 and 155 are formed while interposing a gate insulating layer 140, and the switching and driving semiconductor layers 131 and 132, the switching and driving source electrodes 173 and 176, and the switching and driving drain electrodes 174 and 177 are interconnected through contact holes formed in the gate insulating layer 140 and the interlayer insulating layer 160. Example embodiments, however, are not limited to the above described structure.

The switching thin film transistor 10 is used as a switch for selecting a pixel to be excited. The switching gate electrode 152 is connected to the gate line 151, and the switching source electrode 173 is connected to the data line 171. The switching drain electrode 174 may be spaced apart from the switching source electrode 173 by a distance, and may be connected to the capacitor plate 158.

The driving thin film transistor 20 applies driving power to the pixel electrode 710, so as to excite the organic emissive layer 720 of the OLED 70 within the selected pixel. The driving gate electrode 155 may be connected to the capacitor plate 158 connected with the switching drain electrode 174. The driving source electrode 176 and the capacitor plate 178 may be connected to the common power line 172, respectively. The driving drain electrode 177 may be connected to the pixel electrode 710 of the organic light emitting diode 70 through a contact hole of a planarization layer 180. However, the example embodiments are not limited to the above, e.g., the drain electrode 177 and the pixel electrode 710 may be formed on a same plane while not forming the planarization layer 180. The pixel electrodes 710 may be insulated from each other by way of a pixel definition layer 190 formed on the planarization layer 180.

In the above structure, the switching thin film transistor 10 is operated by way of the gate voltage applied to the gate line 151, so as to transmit the data voltage applied to the data line 171 to the driving thin film transistor 20. A voltage corresponding to a difference between the common voltage applied from the common power line 172 to the driving thin film transistor 20 and the data voltage transmitted from the switching thin film transistor 10 is stored at the capacitor 80, and the current corresponding to the voltage stored at the capacitor 80 flows to the OLED 70 through the driving thin film transistor 20 so that the OLED 70 emits light.

A method of manufacturing an organic light emitting diode display according to a second exemplary embodiment will now be described with reference to FIG. 5A to FIG. 5F. FIG. 5A to FIG. 5F illustrate cross-sectional views of stages in a method of manufacturing an organic light emitting diode display according to a second exemplary embodiment. Detailed description with respect to constituent elements that are identical or extremely similar to those related to the first exemplary embodiment will be omitted in order to make the description clearer.

Figure 5A:
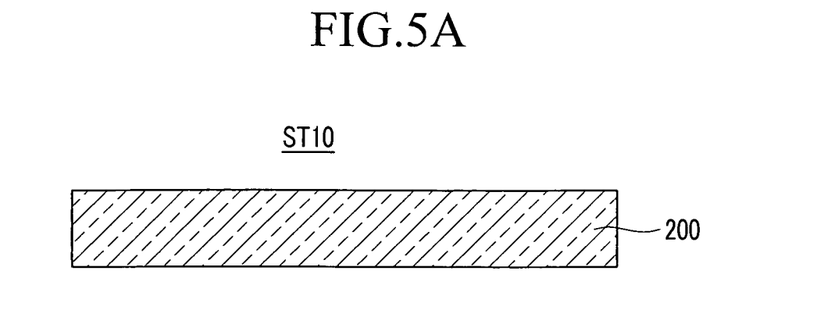
FIG. 5A to FIG. 5F illustrate cross-sectional views of stages in a method of manufacturing an organic light emitting diode display according to a second exemplary embodiment.
Figure 5B:
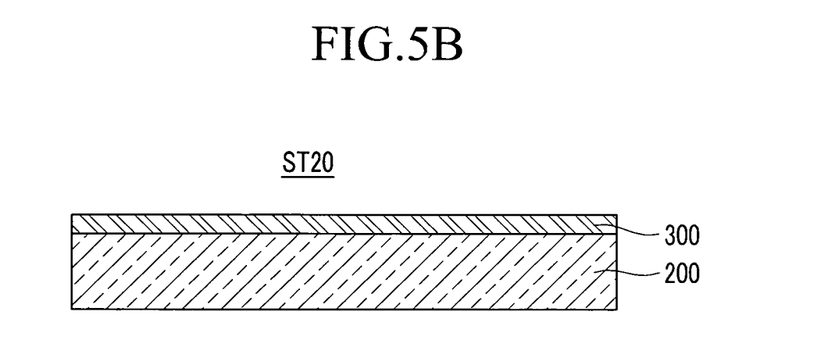

First, as illustrated in FIG. 5A, the support 200 may be prepared in operation ST10. Thereafter, as illustrated in FIG. 5B, the organic layer 300 may be formed on the support 200 in operation ST20.

Figure 5C:
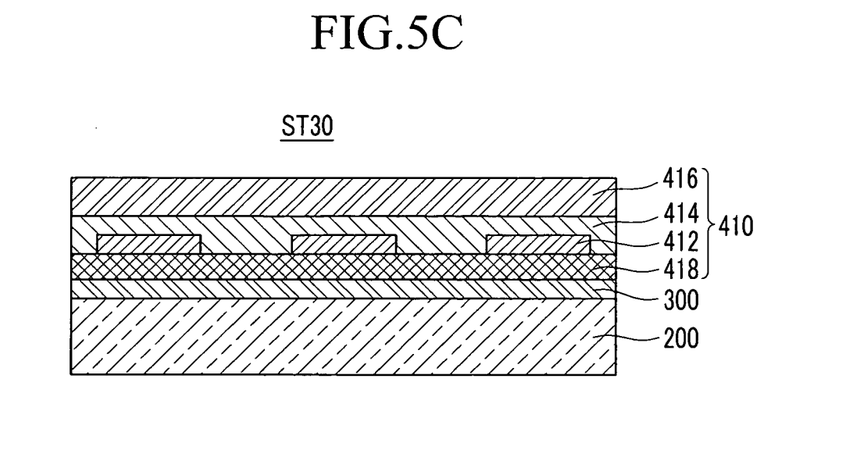

As illustrated in FIG. 5C, a touch sensor 410 may be formed on the organic layer 300 in operation ST30. In the present exemplary embodiment, the touch sensor 410 may include a protective layer 418 on the organic layer 300, the touch electrode pattern 412 on the protective layer 418, the passivation layer 414 on the touch electrode pattern 412, and the polarizing layer 416 on the passivation layer 414.

The passivation layer 414 may have a single-layered structure with an inorganic or organic material-based layer. Furthermore, the passivation layer 414 may have a multiple-layered structure with an inorganic material-based layer and an organic material-based layer. For example, the inorganic material may be silicon oxide and/or silicon nitride, and the organic material may be a polyimide and/or an acryl.

The protective layer 418 may be formed on the passivation layer 414, so the touch electrode pattern 412 may be formed, e.g., sandwiched, therebetween. As lower surfaces of the passivation layer 414 and touch electrode pattern 412 may be substantially coplanar, the protective layer 418 may contact, e.g., directly, both the passivation layer 414 and touch electrode pattern 412. As such, the touch electrode pattern 412 may be enclosed between the passivation layer 414 and the protective layer 418 to be protected from all sides, and may not be exposed to an exterior environment, e.g., atmosphere external to the organic light emitting diode display. The protective layer 418 may be formed of any suitable material capable of preventing the touch electrode pattern 412 from being exposed to the outside while protecting the touch electrode pattern 412. The protective layer 418 may have a single-layered structure with an inorganic or organic material-based layer. Furthermore, the protective layer 418 may have a multiple-layered structure with an inorganic material-based layer and an organic material-based layer. For example, the inorganic material may be silicon oxide and/or silicon nitride, and the organic material may be a polyimide and/or an acryl. For example, the protective layer 418 and the passivation layer 414 may be formed of a substantially same material or different materials to have a substantially same structure or different structures.

Figure 5D:
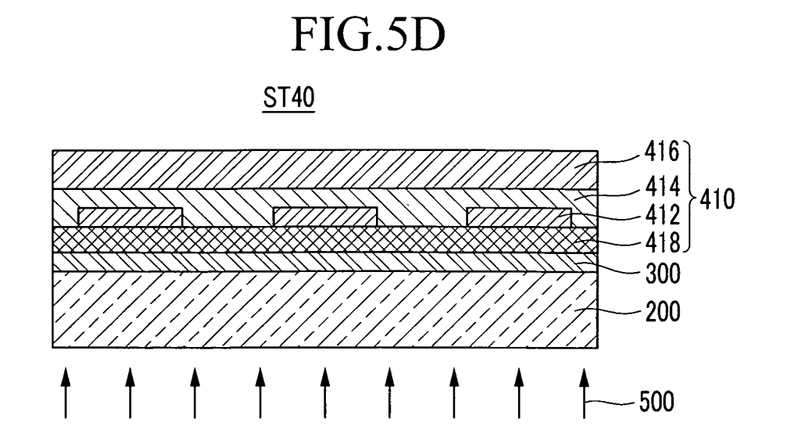
Figure 5E:
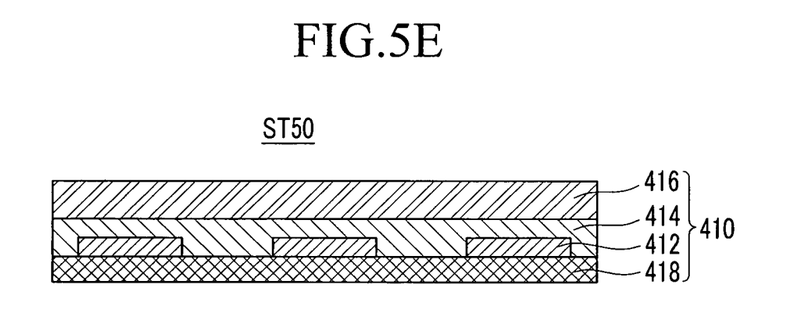

Then, as illustrated in FIG. 5D and FIG. 5E, the touch sensor 410 may be separated from the support 200 by removing the organic layer 300 through illuminating the laser 500 thereto in operation ST40. As discussed previously with reference to FIGS. 2D and 2E, once the organic layer 300 is removed, a completed structure of the touch sensor 410 may be prepared to be attached to the organic light emitting diode display panel 101.

Figure 5F:
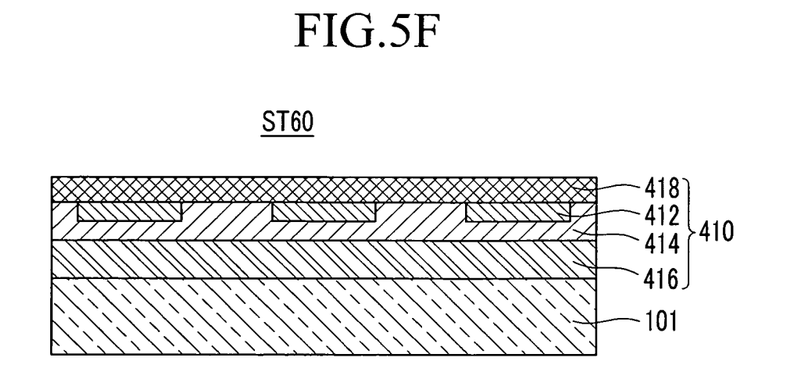

As illustrated in FIG. 5F, the touch sensor 410 may be attached to the organic light emitting diode display panel 101 by using an adhesive in operation ST50. In the present exemplary embodiment, an upper surface of the touch sensor 410 may be attached to the organic light emitting diode display panel 101 via the polarizing layer 416. That is, the polarizing layer 416 may be disposed on, e.g., directly on, the organic light emitting diode display panel 101, so the protective layer 418 may face an exterior of the organic light emitting diode display. As the polarizing layer 416 of the touch sensor 410 is attached to the organic light emitting diode display panel 101, the touch electrode pattern 412 of the touch sensor 410 may be covered by the protective layer 418.

According to exemplary embodiments, the polarizing layer 416 may exhibit excellent adhesive characteristics, and may be attached to the organic light emitting diode display panel 101, i.e., such that the touch sensor 410 and the organic light emitting diode display panel 101 are adhered to each other more rigidly. The protective layer 418 formed on the touch electrode pattern 412 may protect the touch electrode pattern 412, so that reliability of the organic light emitting diode display may be enhanced.

Figure 6:
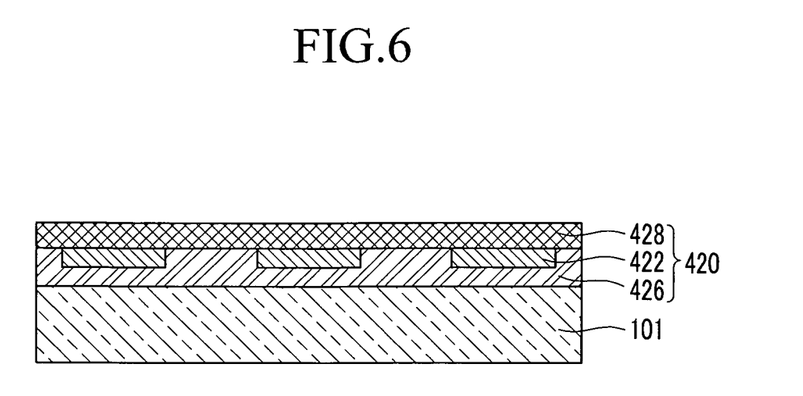
FIG. 6 illustrates a cross-sectional view of an organic light emitting diode display according to a third exemplary embodiment.

A method of manufacturing an organic light emitting diode display according to a third exemplary embodiment will now be described with reference to FIG. 6. FIG. 6 illustrates a cross-sectional view of an organic light emitting diode display according to a third exemplary embodiment. The third exemplary embodiment is substantially the same as the second exemplary embodiment, except that the passivation layer 414 is not formed in the touch sensor.

Referring to FIG. 6, a touch sensor 420 may include a polarizing layer 426 on, e.g., directly on, the touch electrode pattern 422, i.e., a separate passivation layer may not be formed therebetween, and a protective layer 428. As such, the polarizing layer 426 may conduct the functions of passivation and polarization, thereby simplifying the processing steps and reducing costs. The protective layer 428 may be substantially the same as the protective layer 418 described previously with reference to FIGS. 5A-5F, with the exception of contacting directly the polarizing layer 426.

According to exemplary embodiments, an organic light emitting diode display may exhibit excellent visibility and touch screen function, and may be manufactured through simplified processing steps. Furthermore, in the organic light emitting diode display according to exemplary embodiments, a thin touch sensor may be attached to an organic light emitting diode display panel, thereby reducing an overall device thickness. In contrast, in a conventional method of externally mounting a touch panel, the organic light emitting diode display may involve high production cost and may be limited in reducing the thickness thereof, while in a conventional method of internally mounting a touch panel, sensitivity of the touch sensor may be deteriorated.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing an organic light emitting diode display, the method comprising:
    forming an organic layer on a support;
    forming a touch sensor on the organic layer, the touch sensor including a touch electrode pattern and a polarizing layer;
    separating the touch sensor from the support by removing the organic layer; and
    attaching the touch sensor to an organic light emitting diode display panel.

2. The method as claimed in claim 1, wherein separating the touch sensor from the support includes removing the organic layer by irradiating a laser toward the organic layer through the support.

3. The method as claimed in claim 1, wherein forming the touch sensor includes forming the touch electrode pattern on the organic layer, and forming the polarizing layer on the touch electrode pattern.

4. The method as claimed in claim 3, wherein:
    forming the touch sensor includes forming the touch electrode pattern between the organic layer and the polarizing layer, and
    attaching the touch sensor includes attaching a lower surface of the touch sensor to the organic light emitting diode display panel, the lower surface of the touch sensor including surfaces of the touch electrode pattern.

5. The method as claimed in claim 3, wherein forming the touch sensor further comprises forming a passivation layer between the touch electrode pattern and the polarizing layer.

6. The method as claimed in claim 5, wherein the passivation layer is formed to have a single-layered structure or a multi-layered structure including an inorganic material-based layer and/or an organic material-based layer.

7. The method as claimed in claim 6, wherein the inorganic material is silicon oxide and/or silicon nitride, and the organic material is a polyimide and/or an acryl.

8. The method as claimed in claim 1, wherein forming the touch sensor further comprises forming a protective layer on the organic layer, such that the touch electrode pattern is formed between the protective layer and the polarizing layer.

9. The method as claimed in claim 8, wherein attaching the touch sensor includes attaching the polarizing layer of the touch sensor to the organic light emitting diode display panel, such that the touch electrode pattern is between the protective layer and the organic light emitting diode display panel.

10. The method as claimed in claim 8, wherein forming the touch sensor further comprises forming a passivation layer between the touch electrode pattern and the polarizing layer.

11. The method as claimed in claim 10, wherein the passivation layer is formed to have a single-layered structure or a multiple-layered structure including an inorganic material-based layer and/or an organic material-based layer.

12. The method as claimed in claim 11, wherein the inorganic material is silicon oxide and/or silicon nitride, and the organic material is a polyimide and/or an acryl.

13. The method as claimed in claim 1, wherein forming the touch electrode pattern includes patterning a transparent conductive layer through photolithography or laser ablation.

14. The method as claimed in claim 1, wherein forming the organic layer on a support includes forming the organic layer on glass.

* * * * *